(12) United States Patent
Nakaya

(10) Patent No.: US 10,101,704 B2
(45) Date of Patent: Oct. 16, 2018

(54) IMAGE FORMING APPARATUS

(71) Applicant: Masahide Nakaya, Kanagawa (JP)

(72) Inventor: Masahide Nakaya, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/404,959

(22) Filed: Jan. 12, 2017

(65) Prior Publication Data

US 2017/0212466 A1  Jul. 27, 2017

(30) Foreign Application Priority Data

Jan. 27, 2016 (JP) ................................ 2016-013546

(51) Int. Cl.
| | | |
|---|---|---|
| *G03G 15/00* | (2006.01) | |
| *H01L 27/16* | (2006.01) | |
| *H01L 35/30* | (2006.01) | |
| *H01L 35/32* | (2006.01) | |
| *H04N 1/00* | (2006.01) | |

(52) U.S. Cl.
CPC ............ *G03G 15/80* (2013.01); *H01L 27/16* (2013.01); *H01L 35/30* (2013.01); *H01L 35/32* (2013.01); *H04N 1/0049* (2013.01); *H04N 1/00901* (2013.01); *H04N 2201/0082* (2013.01)

(58) Field of Classification Search
CPC .. G03G 15/2039; G03G 15/205; G03G 15/80; G03G 15/5004
See application file for complete search history.

(56) References Cited

U.S. PATENT DOCUMENTS

| | | | |
|---|---|---|---|
| 6,687,420 B1 * | 2/2004 | Matsuda | ................... G06K 9/32 355/25 |
| 2005/0084276 A1 * | 4/2005 | Hirst | ................... G03G 15/2039 399/81 |

FOREIGN PATENT DOCUMENTS

| | | |
|---|---|---|
| JP | 08-145910 | 6/1996 |
| JP | 2004-266984 | 9/2004 |
| JP | 2006-223079 | 8/2006 |
| JP | 2008-203880 | 9/2008 |
| JP | 4530773 | 6/2010 |

* cited by examiner

*Primary Examiner* — Walter L Lindsay, Jr.
*Assistant Examiner* — Jessica L Eley
(74) *Attorney, Agent, or Firm* — Duft Bornsen & Fettig LLP

(57) ABSTRACT

An image forming apparatus includes: an image forming unit configured to form an image on a medium on which an image is to be formed; a placing portion capable of placing the medium; a power generator configured to generate electricity from heat generated inside the image forming unit; and an illumination unit configured to be lit with the electricity generated by the power generator and to be capable of irradiating at least the placing portion with light.

12 Claims, 10 Drawing Sheets

IMAGE FORMING APPARATUS

CROSS-REFERENCE TO RELATED APPLICATIONS

The present application claims priority under 35 U.S.C. § 119 to Japanese Patent Application No. 2016-013546, filed Jan. 27, 2016. The contents of which are incorporated herein by reference in their entirety.

BACKGROUND OF THE INVENTION

1. Field of the Invention

The present invention relates generally to an image forming apparatus.

2. Description of the Related Art

In the field of commercial printing, inspection of a printed output is typically conducted by an operator by visual inspection. For example, Japanese Unexamined Patent Application Publication No. H8-145910 (Patent Document 1) describes a configuration that, upon being fed with an input of an image of a printed output, causes the input image to be displayed on an image display unit so that a judging person judges whether printing is acceptable or unacceptable based on the image of the printed output displayed on the image display unit.

Visual inspection of a printed output, in particular, a printed output obtained by color printing, requires appropriately-adjusted illumination. Conventionally, an operator has conducted inspection of a printed output on a color inspection table provided separately from an image forming apparatus. However, conducting inspection of a printed output away from the image forming apparatus in this manner is unfavorable in terms of efficiency.

SUMMARY OF THE INVENTION

According to an aspect of the present invention, there is provided an image forming apparatus includes: an image forming unit configured to form an image on a medium on which an image is to be formed; a placing portion capable of placing the medium; a power generator configured to generate electricity from heat generated inside the image forming unit; and an illumination unit configured to be lit with the electricity generated by the power generator and to be capable of irradiating at least the placing portion with light.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1A:
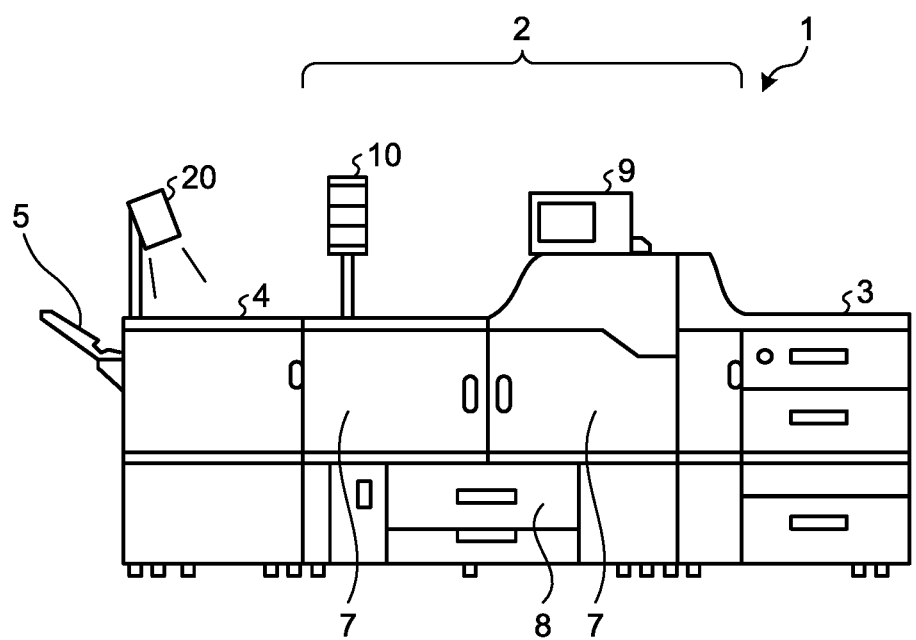
FIG. 1A and FIG. 1B are external views schematically illustrating an example appearance of an image forming apparatus according to embodiments.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

The present invention has an object to provide an image forming apparatus capable of conducting inspection of a printed output printed by the image forming apparatus efficiently.

Configuration Common to Embodiments

Figure 1B:
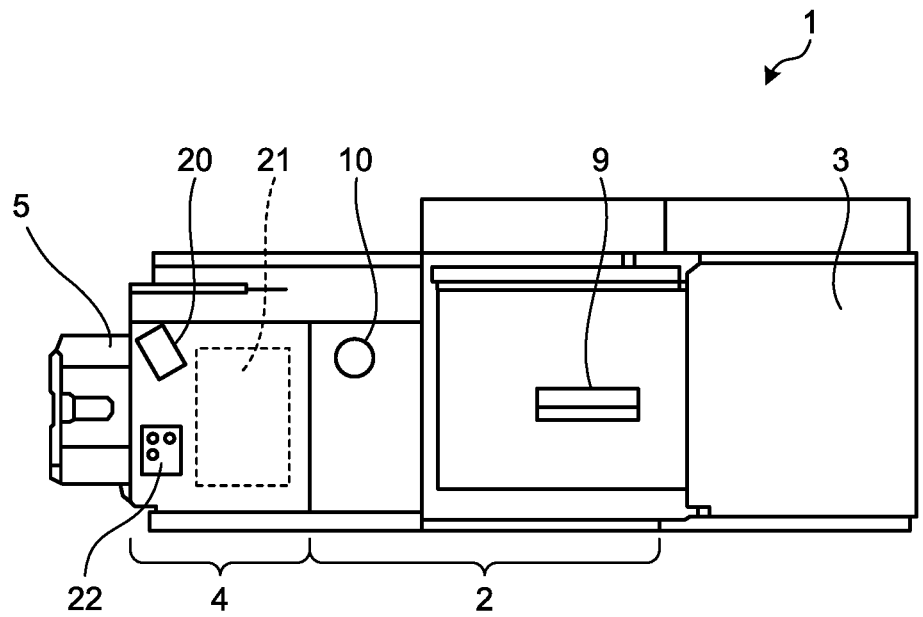

FIG. 1A and FIG. 1B are external views schematically illustrating an example appearance of an image forming apparatus 1 according to the embodiments. FIG. 1A is a side view of the image forming apparatus 1. FIG. 1B is a top view of the image forming apparatus 1. The image forming apparatus 1 includes a main body unit 2, a paper feeding unit 3, and a paper ejection unit 4. The main body unit 2 includes principle elements that form an image on a print medium (a medium on which an image is to be formed). The paper feeding unit 3 stores paper (the print medium) therein and feeds the paper to the main body unit 2. The paper ejection unit 4 performs a fixing process on the paper, on which an image is formed in the main body unit 2.

The main body unit 2 includes, on its top portion, an operating unit 9 and a signal lamp 10. Interface for accepting operation inputs from a user is arranged on the operating unit 9. The signal lamp 10 indicates an operating state of the image forming apparatus 1 with light of different colors, which may be blue, yellow, and red, for example. The main body unit 2 includes, on its front center, doors 7 that cover toner and the like housed inside the main body unit 2. When the doors 7 are open, a drive system and the like are stopped to secure user safety during operation.

In this example, the image forming apparatus 1 uses, as an image forming method, electrophotography that forms an image on a print medium using toner of different colors. Toner cartridges for supplying toner of the different colors, which may be, for example, Y (yellow), M (magenta), C (cyan), and K (black), are detachably mounted on the image forming apparatus 1. Each of the toner cartridges can be removed from or attached to the main body unit 2 with the doors 7 open, for example.

An illumination lamp 20, a placing portion 21, and an illumination operating unit 22 are mounted on a top portion of the paper ejection unit 4. The placing portion 21 is provided to support a printed print medium, on which an image is formed by the image forming apparatus 1, placed thereon. The placing portion 21 may be obviously provided or, alternatively, the top surface of the paper ejection unit 4 may be formed as a flat surface to serve as the placing portion 21.

The illumination lamp 20 is mounted on the paper ejection unit 4 with a retainer. The illumination lamp 20 can be configured to be detachable from the image forming apparatus 1 by configuring the retainer that holds the illumination lamp 20 to be detachable from the paper ejection unit 4. The illumination lamp 20 includes one or more light sources (hereinafter, simply referred to as "light sources") and is situated such that the illumination lamp 20 can irradiate a front surface of the placing portion 21 with light emitted from the light sources. Power supply for lighting the light sources of the illumination lamp 20 is supplied from inside the image forming apparatus 1. Arrangement of the illumination lamp 20 is not limited to the above-described example. Arrangement, in which the placing portion 21 is made of a transparent member and the placing portion 21 is irradiated with light from inside the paper ejection unit 4, may be used. A plurality of the illumination lamps 20 may be provided. The illumination operating unit 22 adjusts light emitted from the light sources included in the illumination lamp 20 in response to user's operation.

The image forming apparatus 1 forms an image with toner of the respective colors (Y, M, C, and K) in accordance with image data fed from an external computer or the like on a print medium fed from the paper feeding unit 3, for example. For example, the image forming apparatus 1 performs exposure on photoconductor drums each uniformly electrostatically charged by an electrostatic charger by irradiating the photoconductor drums with laser beams, thereby forming electrostatic latent images in accordance with the image data, and causes toner fed from the toner cartridges to stick to the electrostatic latent images. The toner is transferred from the photoconductor drums to a print medium. The print medium, to which the toner is transferred, is moved to the paper ejection unit 4, where the toner is fixed with heat and pressure applied by the fixing device. Thus, an image is formed on the print medium in accordance with the image data. The print medium, on which the image is formed, is ejected from the paper ejection unit 4 onto a paper ejection tray 5. The image forming apparatus 1 can form an image on a print medium housed in a paper feed tray 8 that is mounted in a lower portion of the main body unit 2 as well.

For example, an operator of the image forming apparatus 1 can place the print medium ejected onto the paper ejection tray 5 on the placing portion 21 and cause the illumination lamp 20 to be lit by operating the illumination operating unit 22, thereby conducting visual inspection of the image formed on the print medium placed on the placing portion 21. Because the illumination lamp 20 and the placing portion 21 are mounted on the image forming apparatus 1, the operator can conduct visual inspection of the image formed on the print medium without moving to a location away from the image forming apparatus 1.

In the above description, the image forming apparatus 1 is described as forming an image on a print medium by electrophotography; however, the image forming method is not limited thereto. For example, the image forming apparatus 1 may use an inkjet method that forms an image on a print medium with ink ejected from nozzles as the image forming method. In this case, the main body unit 2 may include, for example, an ink cartridge that stores ink of the respective colors (C, M, Y, and K), nozzles for the respective colors for ejecting ink supplied from the ink cartridge, and a control mechanism that controls ink supply from the ink cartridge to the nozzles. The paper ejection unit 4 may include a heating mechanism for drying a print medium, to which the ejected ink is sticking.

Figure 2:
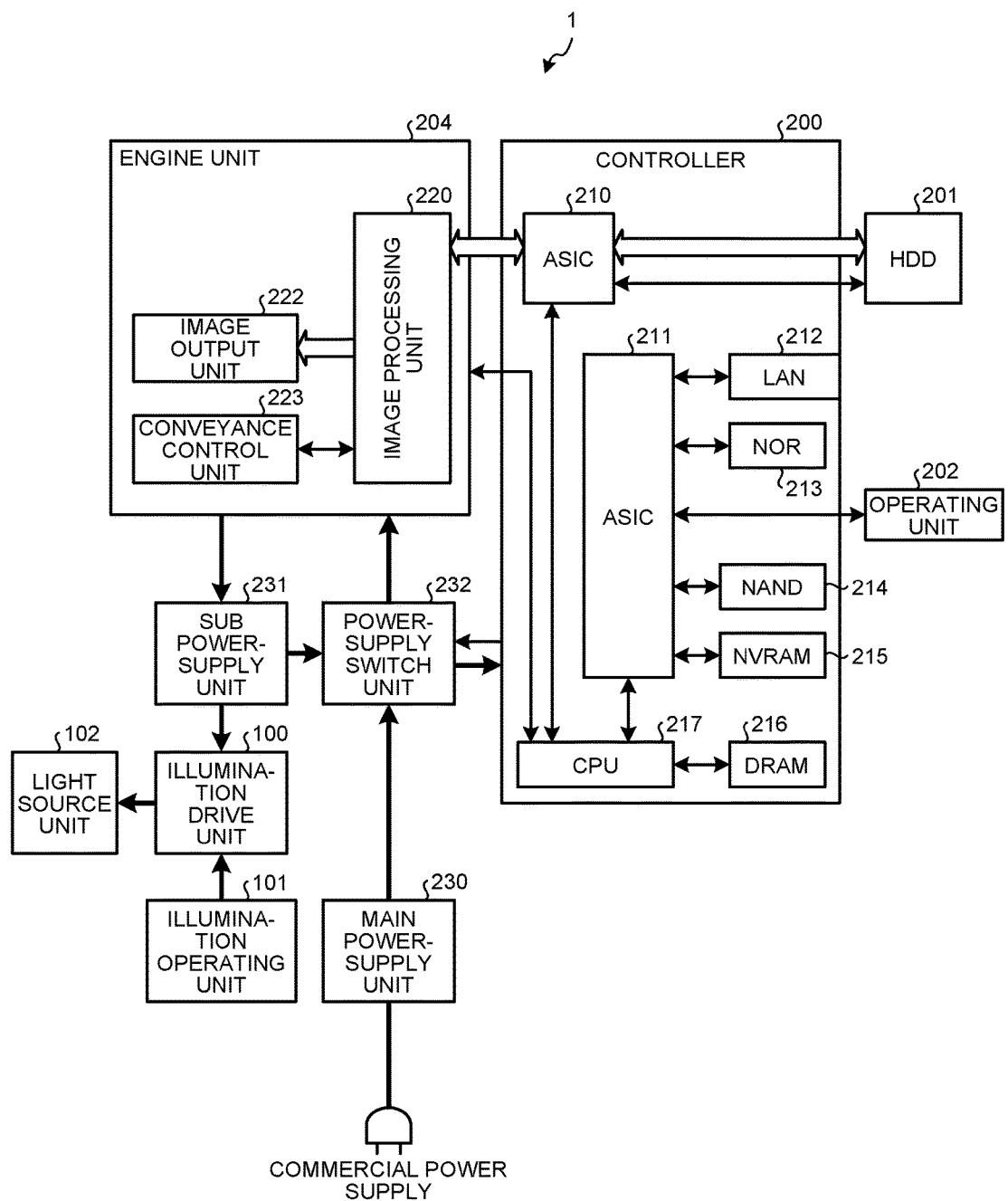
FIG. 2 is a block diagram illustrating an example configuration of the image forming apparatus according to the embodiments.

FIG. 2 illustrates an example configuration of the image forming apparatus 1 according to the embodiments. The image forming apparatus 1 includes a controller 200, a hard disk drive (HDD) 201, an operating unit 202, an engine unit 204, a main power-supply unit 230, a sub power-supply unit 231, and a power-supply switch unit 232. The image forming apparatus 1 has, as operating mode, a normal mode and a sleep mode where power consumption is reduced relative to the normal mode.

The image forming apparatus 1 further includes, as elements related to the above-described illumination lamp 20, an illumination drive unit 100, an illumination operating unit 101, and a light source unit 102.

The engine unit 204 includes an image processing unit 220, an image output unit 222, and a conveyance control unit 223. The image processing unit 220 performs predetermined image processing, such as retouching, correction, editing, detection, and conversion, on image data fed from the controller 200. The image output unit 222, which is included in the main body unit 2, forms an image in accordance with image data output from the image processing unit 220. Specifically, the image output unit 222 performs printing on a print medium or the like in accordance with the image data. The conveyance control unit 223 controls conveyance of the print medium. The conveyance control unit 223 also controls heating by the fixing device.

The engine unit 204 includes a thermoelectric generator module including a thermoelectric generator that converts heat into electricity and therefore can convert heat generated at a heat generating area(s) in the engine unit 204 into electricity. The electricity, into which heat is converted by the thermoelectric generator module, is supplied to the sub power-supply unit 231. The thermoelectric generator module will be described in detail later.

The sub power-supply unit 231 performs, on the electricity supplied from the engine unit 204, voltage conversion to a predetermined voltage and supplies the electricity as power supply to the power-supply switch unit 232 and the illumination drive unit 100. The sub power-supply unit 231 includes a storage battery, a recharging unit that controls charging the storage battery, and a discharging unit that controls discharging the storage battery and can store the electricity supplied from the engine unit 204 in the storage battery.

The main power-supply unit 230 generates, from commercial power supply, for example, power supply for use by elements of the image forming apparatus 1. The power supply output from the main power-supply unit 230 is supplied to the engine unit 204 and the controller 200 via the power-supply switch unit 232.

The power-supply switch unit 232 is configured to supply the power supply from the main power-supply unit 230 to, for example, each of the engine unit 204 and the controller 200 in the normal mode but supply the power supply from the main power-supply unit 230 only to the controller 200 in the sleep mode. With this configuration, power consumption in the sleep mode can be reduced. The power-supply switch unit 232 may further preferably be configured to supply the power supply output from the sub power-supply unit 231 to the controller 200 in the sleep mode when the amount of electricity stored in the storage battery included in the sub power-supply unit 231 is equal to or larger than a predetermined value. With this configuration, power consumption in the sleep mode can be further reduced.

The controller 200 includes an ASIC (Application Specific Integrated Circuit) 210, an ASIC 211, a LAN I/F (Local Area Network Interface) 212, and a CPU (Central Processing Unit) 217. The controller 200 further includes a NOR flash memory 213, a NAND flash memory 214, an NVRAM (Non-Volatile Random Access Memory) 215, and a DRAM (Dynamic RAM) 216, each being a memory.

The ASIC 210, to which the HDD 201, the CPU 217, and the image processing unit 220 are connected, controls data transfer between the HDD 201, the CPU 217, and the image processing unit 220. For example, image data fed via the LAN I/F 212, which will be described later, is subjected to compression encoding performed by the ASIC 210 and temporarily stored in the HDD 201. When printing is to be performed, the compressed image data is read out from the HDD 201, decompressed by the ASIC 210, and fed to the image processing unit 220. The image processing unit 220 performs predetermined image processing on the image data fed from the ASIC 210 and supplies the image-processed image data to the image output unit 222.

The operating unit 202, the LAN I/F 212, and the CPU 217 are connected to the ASIC 211. Furthermore, the NOR flash memory 213, the NAND flash memory 214, and the NVRAM 215, each being a memory, are connected to the ASIC 211. The ASIC 211 controls data transfer between these elements connected to the ASIC 211.

Program instructions, such as firmware, are stored in the NOR flash memory 213. A predetermined table and the like are stored in the NAND flash memory 214 in advance. Setting values related to the image forming apparatus 1 and the like are stored in the NVRAM 215 in advance. The CPU 217 controls operations of the overall image forming apparatus 1 in accordance with, for example, the program instructions stored in the NOR flash memory 213 while using the DRAM 216 as a working memory.

The operating unit 202 corresponds to the operating unit 9 of FIG. 1A and FIG. 1B and includes operating controls for user operations, a display unit, and a driver circuit for driving the operating controls and the display unit. The operating unit 202 may be embodied as what is generally referred to as a touch screen, into which the operating controls and the display unit are integrated. The operating unit 202 outputs a control signal that depends on an operation. The control signal is fed to the CPU 217 via the ASIC 211. The display unit provides predetermined display based on a display control signal generated by the CPU 217 in accordance with program instructions and fed to the display unit via the ASIC 211. A GUI (Graphical User Interface) that allows a user to operate the image forming apparatus 1 is made by combining the display provided on the display unit and the operating controls.

The illumination operating unit 101 corresponds to the above-described illumination operating unit 22 and outputs a control signal that depends on user's operation performed on one of the operating controls or the like. The light source unit 102 includes the light sources included in the above-described illumination lamp 20. The illumination drive unit 100 drives the light source unit 102 with the power supply supplied from the sub power-supply unit 231, thereby lighting the illumination lamp 20. The illumination drive unit 100 also controls on and off of light emission from each of the light sources included in the light source unit 102 and light-emission intensity of each of the light sources in accordance with the control signal fed from the illumination operating unit 101.

The thermoelectric generator module that is applicable to the embodiments and that includes the thermoelectric generator is described below. The thermoelectric generator is a device that utilizes a phenomenon of, by utilizing the Seebeck effect that an electromotive force is developed when two different metals or semiconductors are joined and a temperature difference is developed across the two junctions, converting a temperature difference across a material directly into a voltage.

When one end of the thermoelectric generator formed by joining two different metals or semiconductors is heated, a temperature difference is developed between the one end and the other end, causing electrons to flow toward a cooler one of the junctions. This phenomenon breaks electron density balance and develops a potential difference V. An electric current flows in a manner to compensate for the potential difference V. The potential difference V can be expressed using a temperature difference $\Delta T$ by Equation (1) below. In Equation (1), the coefficient $\alpha$ is the Seebeck coefficient that depends on the absolute temperature, material, and molecular structure of the thermoelectric generator.

$$V = \alpha \cdot \Delta T \quad (1)$$

As can be seen from Equation (1), as the temperature difference $\Delta T$ between the opposite ends of the thermoelectric generator increases, the potential difference V increases and, as a result, a high voltage can be obtained. The thermoelectric generator module is formed by closely laying a plurality of such thermoelectric generators and connecting the thermoelectric generators. Heating one surface of the thermoelectric generator module while cooling the other surface develops the temperature difference $\Delta T$, by which the potential difference V is developed and, as a result, electricity is generated.

Figure 3:
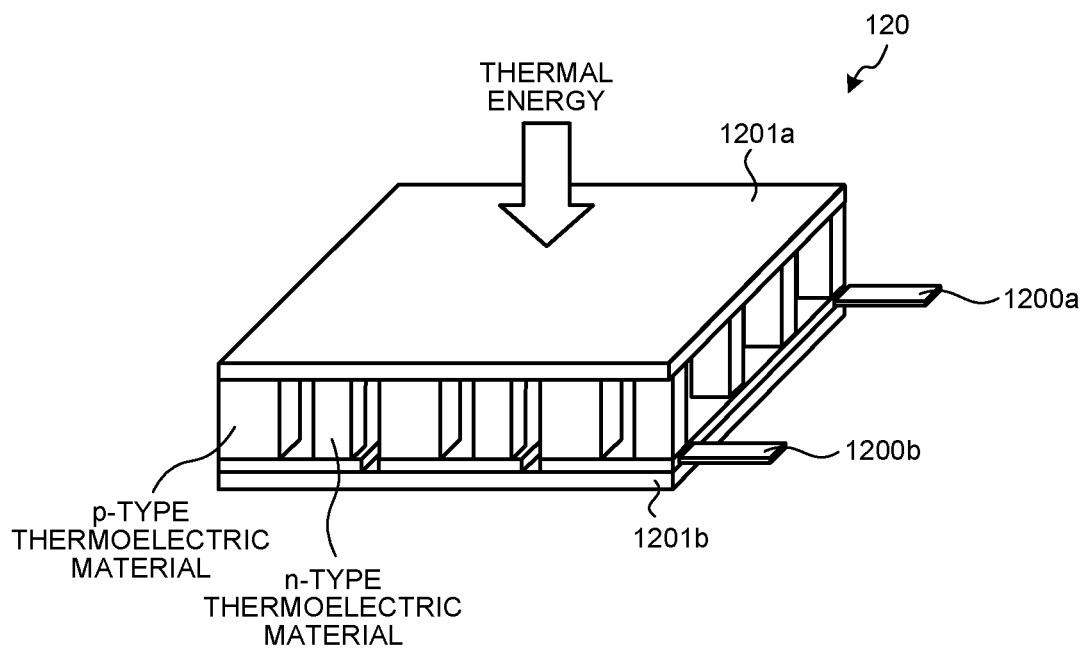
FIG. 3 is a diagram illustrating an example configuration of a thermoelectric generator module applicable to the embodiments.

FIG. 3 illustrates an example configuration of a thermoelectric generator module 120 applicable to the embodiments. In the example illustrated in FIG. 3, as the thermoelectric generator, a p-type thermoelectric material that uses a p-type semiconductor and an n-type thermoelectric material that uses an n-type semiconductor are used. In the thermoelectric generator module 120, a plurality of pairs, each pair being formed by serially-connecting the p-type thermoelectric material and the n-type thermoelectric material, are serially connected and arranged parallel to a direction where the temperature difference ΔT exists. By serially connecting the plurality of pairs, each pair being formed by serially connecting the p-type thermoelectric material and the n-type thermoelectric material, in this manner, a still higher voltage can be obtained.

The pairs of the p-type thermoelectric material and the n-type thermoelectric material arranged as described above are sandwiched between ceramic substrates 1201a and 1201b. The temperature difference ΔT is caused to develop across junctions of the p-type thermoelectric material and the n-type thermoelectric material by heating the ceramic substrate 1201a by, for example, applying thermal energy thereto. Electricity generated by the potential difference V that is developed by the temperature difference ΔT is drawn out at output terminals 1200a and 1200b.

At this time, by cooling the side opposite from the surface where thermal energy is applied or, in short, by cooling the ceramic substrate 1201b, the temperature difference ΔT can be further increased and, as a result, a larger amount of electricity can be obtained. Hereinafter, in the thermoelectric generator module 120, the surface (e.g., the ceramic substrate 1201a) to be heated to generate electricity is referred to as a hot surface, while the surface to be cooled is referred to as a cold surface.

Figure 4:
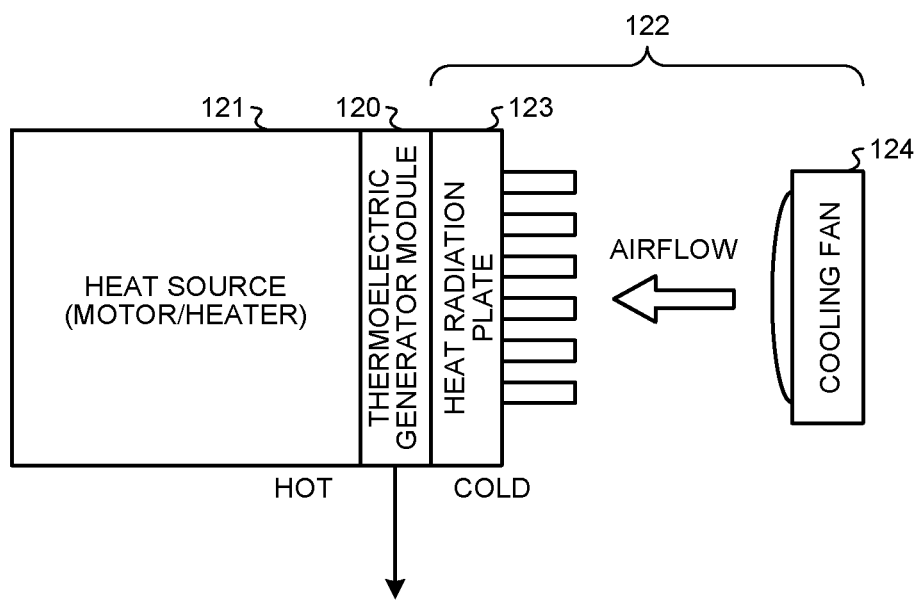
FIG. 4 is a diagram for describing an example of usage of the thermoelectric generator module applicable to the embodiments.

An example usage of the thermoelectric generator module 120 applicable to the embodiments is described below with reference to FIG. 4. A heat source 121 is brought into thermal contact with the hot surface of the thermoelectric generator module 120 using thermal conductive grease or the like. A cooling unit 122 includes a heat radiation plate 123 and a cooling fan 124. The heat radiation plate 123 is brought into thermal contact with the cold surface of the thermoelectric generator module 120 using thermal conductive grease or the like. The cooling fan 124 cools the heat radiation plate 123 with airflow. The cooling fan 124 generates the airflow by, for example, rotating rotary blades using a DC (direct current) motor.

As described above, the thermoelectric generator module 120 generates electricity by developing an electromotive force that depends on the temperature difference ΔT between the hot surface and the cold surface. The electricity generated by thermoelectric generator module 120 is supplied to the above-described sub power-supply unit 231.

First Embodiment

A first embodiment is described below. In the first embodiment, the illumination lamp 20 is arranged on the top portion of the paper ejection unit 4 of the image forming apparatus 1 such that the front surface of the placing portion 21 is irradiated with light emitted from the illumination lamp 20. Hereinafter, the term "front surface" is used as an antonym of "back surface". Power supply that drives the light sources included in the illumination lamp 20 is supplied using the electricity generated by the thermoelectric generator module 120 by using, as the heat source 121, the fixing device included in the paper ejection unit 4 of the image forming apparatus 1.

Figure 5:
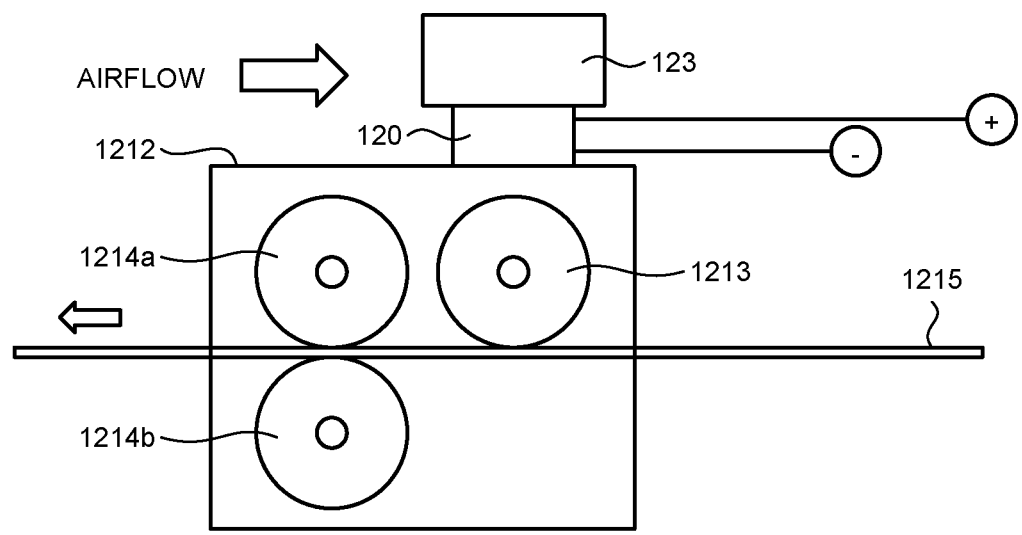
FIG. 5 is a diagram illustrating an example where a fixing device is used as a heat source for the thermoelectric generator module according to a first embodiment.

FIG. 5 illustrates an example where the fixing device is used as the heat source 121 for the thermoelectric generator module 120 according to the first embodiment. Referring to FIG. 5, a fixing device 1212 includes a heating roller 1213 and a pair of conveying rollers 1214a and 1214b. The heating roller 1213 includes a heater, to which power supply is supplied from the main power-supply unit 230, for example, and is heated by the heater. A print medium 1215, to which toner of the respective colors are applied in the main body unit 2, advances into the fixing device 1212, where heat is applied to the print medium 1215 by the heating roller 1213. As a result, the toner on the print medium 1215 is fixed onto the print medium 1215. The print medium 1215, onto which the toner is fixed, is ejected from the fixing device 1212 by the conveying rollers 1214a and 1214b. The conveying roller 1214a may include a heater to further heat the print medium 1215.

The hot surface of the thermoelectric generator module 120 is brought into thermal contact with an upper surface of the heating roller 1213 of the fixing device 1212 using thermal conductive grease or the like. Similarly, the heat radiation plate 123 is brought into thermal contact with the cold surface of the thermoelectric generator module 120 using thermal conductive grease or the like. When the print medium 1215 is heated by the heating roller 1213, moisture contained in the print medium 1215 is released as water vapor. To diffuse this water vapor, an air blower mechanism using a fan is provided above the fixing device 1212. By using airflow generated by the air blower mechanism as airflow that is caused to strike the heat radiation plate 123 that cools the thermoelectric generator module 120, the need for additionally providing the cooling fan 124 for the thermoelectric generator module 120 can be eliminated.

When heating by the heating roller 1213 is started and temperature rise occurs in the fixing device 1212, an airflow generated by the air blower mechanism develops the temperature difference ΔT between the hot surface and the cold surface of the thermoelectric generator module 120. The thermoelectric generator module 120 generates electricity that depends on the temperature difference ΔT.

Figure 6:
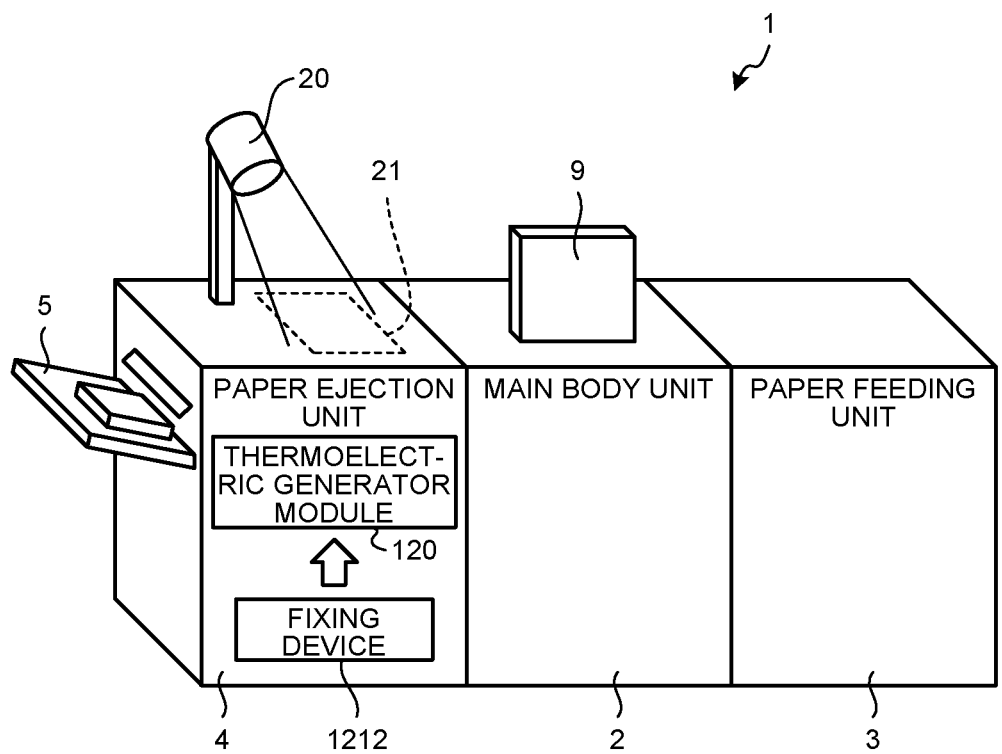
FIG. 6 is a perspective view schematically illustrating appearance of the image forming apparatus according to the first embodiment.

FIG. 6 is a perspective view schematically illustrating appearance of the image forming apparatus 1 according to the first embodiment. The image forming apparatus 1 illustrated in FIG. 6 is configured as follows. The illumination lamp 20 is mounted on the top portion of the paper ejection unit 4 such that the side of the front surface (the side where a print medium to be inspected is to be placed) of the placing portion 21 is irradiated with light emitted from the illumination lamp 20. The fixing device 1212 is used as the heat source 121 for the thermoelectric generator module 120. The illumination lamp 20 is lit using electricity generated by the thermoelectric generator module 120.

In the first embodiment, because the illumination lamp 20 and the placing portion 21 are situated on the image forming apparatus 1, an operator can conduct visual inspection of the image formed on a print medium without moving to a location away from the image forming apparatus 1. Consequently, working efficiency is increased. Furthermore, because the power supply of the illumination lamp 20 is obtained by converting, by the thermoelectric generator module 120, heat generated inside the image forming apparatus 1 into electricity, reduction in power consumption can be achieved.

Figure 7:
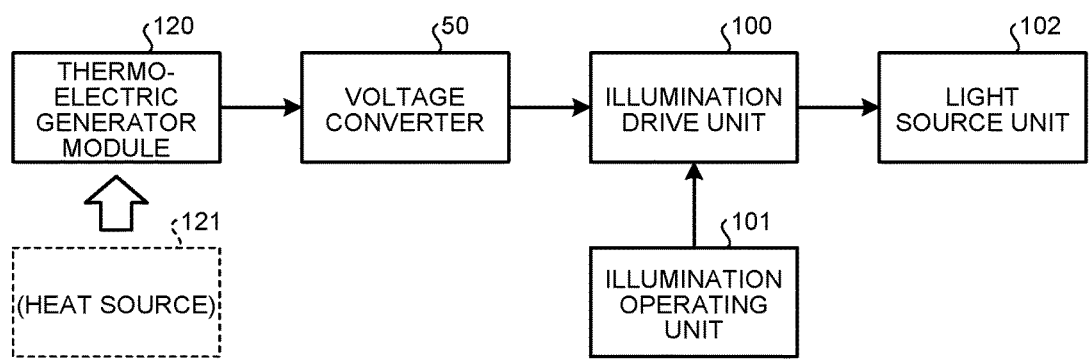
FIG. 7 is a block diagram illustrating an example configuration for driving an illumination lamp according to the first embodiment.

FIG. 7 illustrates an example configuration for driving the illumination lamp 20 according to the first embodiment. Referring to FIG. 7, the thermoelectric generator module 120 is a power generator that generates electricity from heat of the heat source 121 (in this example, the fixing device 1212) and supplies the generated electricity to a voltage converter 50. The voltage converter 50 converts the voltage of the electricity supplied from the thermoelectric generator module 120 to a voltage, at which the light sources of the light source unit 102 included in the illumination lamp 20 can be driven, and supplies the voltage-converted electricity to the illumination drive unit 100. The voltage converter 50 is included in the sub power-supply unit 231 of FIG. 2.

The illumination drive unit 100 outputs the electricity supplied from the voltage converter 50 as power supply to the light source unit 102. The light source unit 102 includes the one or more light sources that emit light using the power supply supplied from the illumination drive unit 100. The illumination lamp 20 is lit such that the light sources included in the light source unit 102 emit light. The illumination drive unit 100 also controls on and off of light emission by and light-emission intensity of the light source unit 102 in accordance with a control signal fed from the illumination operating unit 101 in response to an operation performed on the illumination operating unit 101.

An overview of a configuration of the light source unit 102 is described below. In each of the embodiments, LEDs (Light Emitting Diodes) are generally used as the light sources included in the light source unit 102. Note that the illumination lamp 20 is preferably capable of emitting white light for inspection of a printed output. Conceivable examples of a method for obtaining white light using LEDs include the following two methods.

(1) A method of obtaining white light using a blue LED that emits blue light and a yellow phosphor that emits yellow fluorescence when excited by irradiation with blue light.
(2) A method of obtaining white light by using LEDs of three types that respectively emit red light, green light, and blue light and mixing the red light, the green light, and the blue light by additive color mixing.

Figure 8:
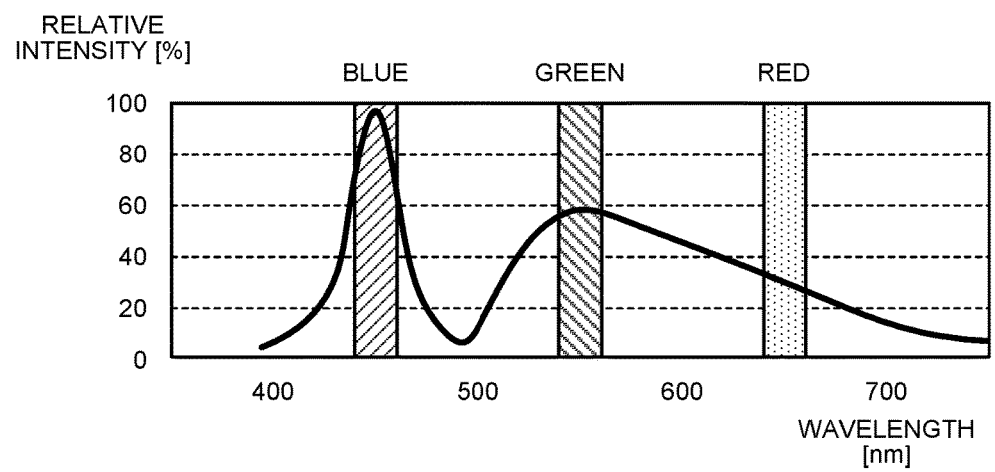
FIG. 8 is a diagram illustrating an example of wavelength distribution of white light obtained using a blue LED and a yellow phosphor.
Figure 9:
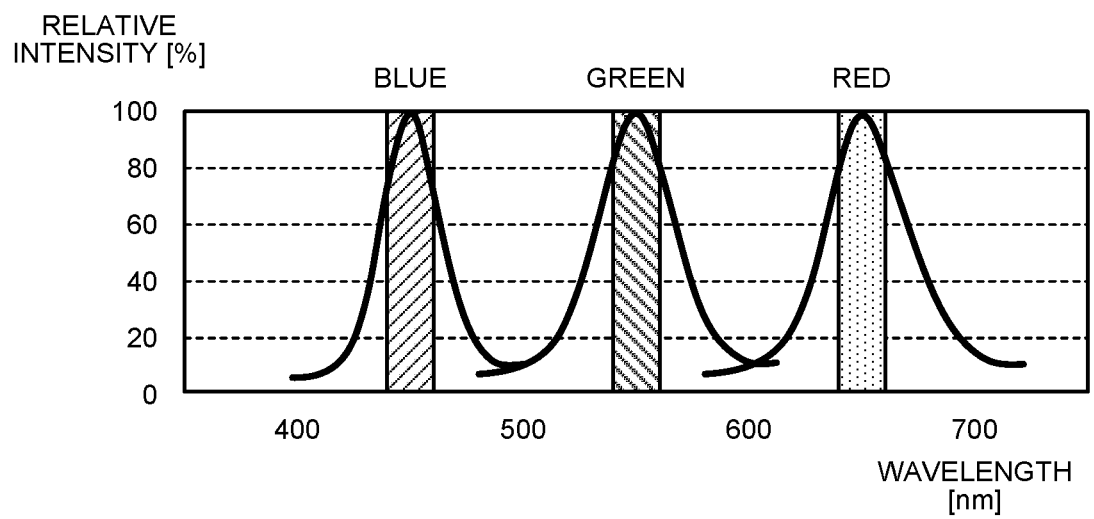
FIG. 9 is a diagram illustrating an example of wavelength distribution of white light obtained using a blue LED, a green LED, and a red LED.

FIG. 8 illustrates an example of wavelength distribution of white light obtained using a blue LED and a yellow phosphor of the method (1). In FIG. 8 and FIG. 9, which will be described later, it is assumed that center wavelength of the red light, that of the green light, and that of the blue light are 650 nm, 550 nm, and 450 nm, respectively. When a blue LED and a yellow phosphor are used, as illustrated in FIG. 8, the light-emission intensity is low in the red region and therefore color rendering property in this region is likely to be poor. Hereinafter, the white light obtained using blue light and yellow light is referred to as pseudo-white light.

FIG. 9 illustrates an example of wavelength distribution of white light obtained using a blue LED, a green LED, and a red LED of the method (2). With this wavelength distribution, because light-emission intensities of blue, green, and red are controllable independently of each other, white light and light of a desired color can be emitted easily.

Figure 10:
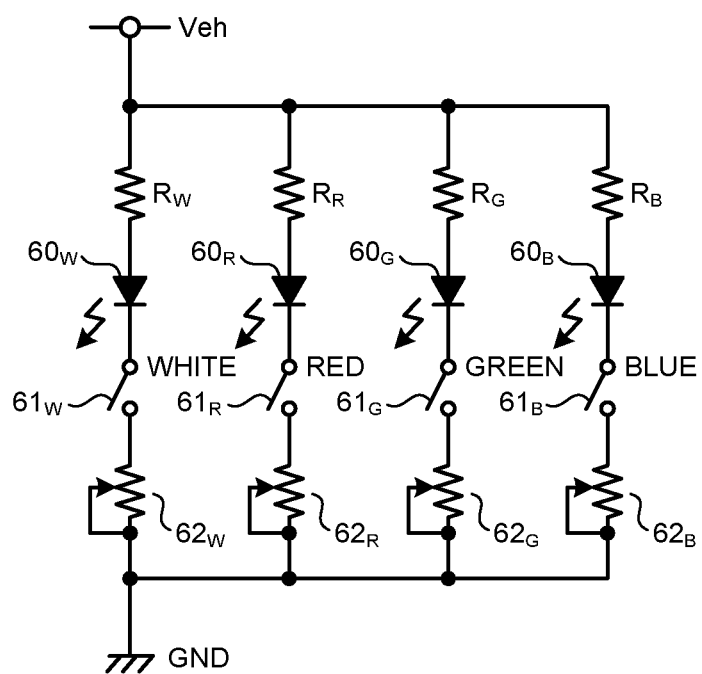
FIG. 10 is a circuit diagram illustrating an example of an LED lighting circuit applicable to the embodiments.

A circuit diagram illustrating an example of an LED lighting circuit of the light source unit 102 applicable to the embodiments is given in FIG. 10. Referring to FIG. 10, LEDs $60_R$, $60_G$, and $60_B$ are single-color-light-emitting LEDs that emit red light, green light, and blue light, respectively. An LED $60_W$ is an LED for obtaining pseudo-white light by combining a blue LED and a yellow phosphor.

Referring to FIG. 10, power supply Veh, which originates from the electricity generated by the thermoelectric generator module 120, is supplied from the sub power-supply unit 231. The power supply Veh is supplied to each of the LEDs $60_W$, $60_R$, $60_G$, and $60_B$ via resistors $R_W$, $R_R$, $R_G$, and $R_B$, which are current-limiting resistors, respectively. Cathodes of the LEDs $60_W$, $60_R$, $60_G$, and $60_B$ are grounded (GND) via switches $61_W$, $61_R$, $61_G$, and $61_B$ and variable resistors $62_W$, $62_R$, $62_G$, and $62_B$.

Each of the switches $61_W$, $61_R$, $61_G$, and $61_B$ switches on and off a corresponding one of the LEDs $60_W$, $60_R$, $60_G$, and $60_B$ in response to an operation performed on the illumination operating unit 101. Each of the variable resistors $62_W$, $62_R$, $62_G$, and $62_B$ changes an electric current flowing through a corresponding one of the LEDs $60_W$, $60_R$, $60_G$, and $60_B$ in response to an operation performed on the illumination operating unit 101. Thus, light-emission intensity of each of the LEDs $60_W$, $60_R$, $60_G$, and $60_B$ can be adjusted.

For example, when the switch $61_W$ is on and the other switches $61_R$, $61_G$, and $61_B$ are off, inspection of a printed output can be conducted using pseudo-white light of the LED $60_W$. Similarly, when the switch $61_W$ is off and the other switches $61_R$, $61_G$, and $61_B$ are on, inspection of a printed output can be conducted using light, which may be white light, for example, obtained by mixing the light of the respective colors of the LEDs $60_R$, $60_G$, and $60_B$. At this time, the color to be rendered with the light of the respective colors of the LEDs $60_R$, $60_G$, and $60_B$ is adjustable by appropriately adjusting resistance values of the variable resistors $62_R$, $62_G$, and $62_B$.

The above-described configuration can provide high energy saving capability because the power supply Veh is supplied from the electricity generated by the thermoelectric generator module 120.

First Modification of First Embodiment

A first modification of the first embodiment is described below. In the above-described image forming apparatus 1 according to the first embodiment, the illumination lamp 20 is mounted on the top portion of the paper ejection unit 4 such that the front surface of the placing portion 21 is irradiated with light emitted from the illumination lamp 20. By contrast, in the first modification of the first embodiment, the back surface of the placing portion 21 is irradiated with light emitted from the illumination lamp 20.

Figure 11:
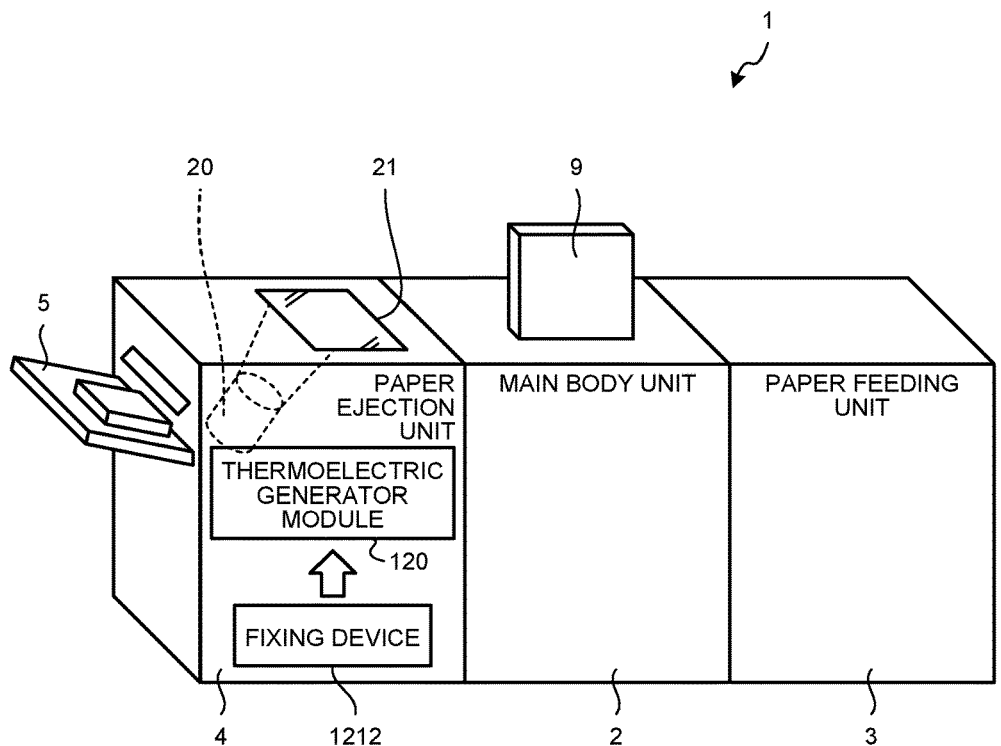
FIG. 11 is a perspective view schematically illustrating appearance of the image forming apparatus according to a first modification of the first embodiment.

FIG. 11 is a perspective view schematically illustrating appearance of the image forming apparatus 1 according to the first modification of the first embodiment. In FIG. 11, the image forming apparatus 1 is configured such that the illumination lamp 20 is mounted inside the paper ejection unit 4 and such that light from the inside of the paper ejection unit 4 can transmit through the placing portion 21. More specifically, in the image forming apparatus 1, the placing portion 21 is configured to have, for example, a window portion in a predetermined area of the top surface of the paper ejection unit 4 and a transparent glass, an acrylic board, or the like mounted on this window portion. In the image forming apparatus 1, the illumination lamp 20 is mounted inside the paper ejection unit 4 such that the back surface of the placing portion 21 is irradiated with light emitted from the illumination lamp 20. This configuration enables, when an image is formed on a transparent or translucent print medium, hue inspection can be conducted easily using light coming from the back surface of the print medium and transmitted therethrough.

Second Modification of First Embodiment

Figure 12:
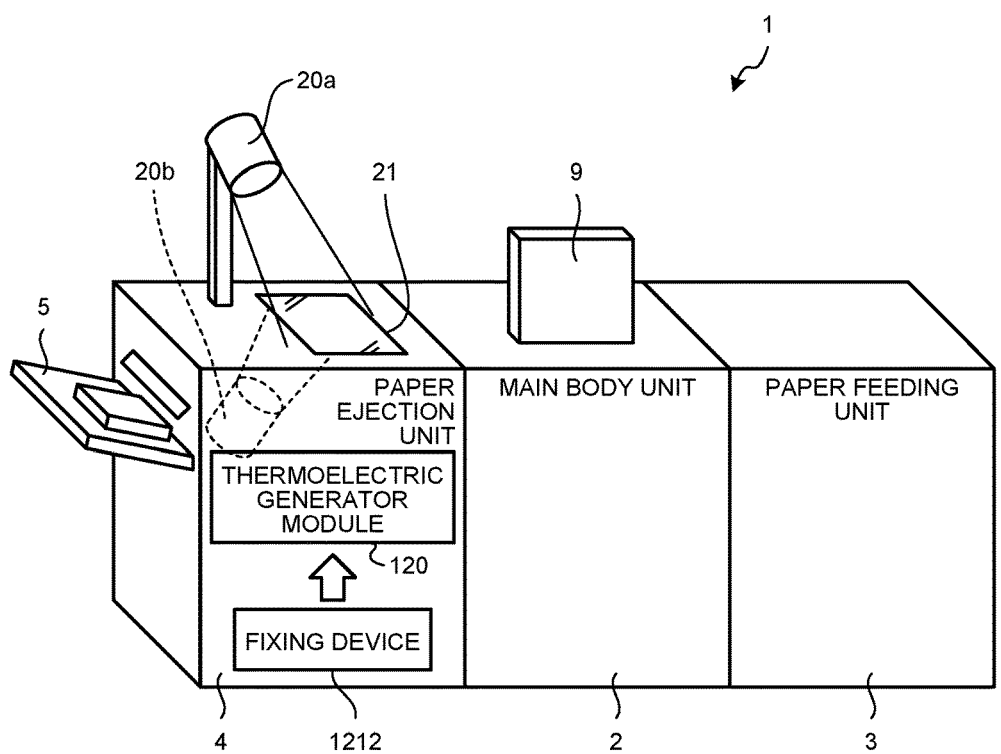
FIG. 12 is a perspective view schematically illustrating appearance of the image forming apparatus according to a second modification of the first embodiment.

A second modification of the first embodiment is described below. The second modification of the first embodiment is an example, in which the first embodiment and the first modification described above are combined. FIG. 12 is a perspective view schematically illustrating appearance of the image forming apparatus 1 according to the second modification of the first embodiment.

Referring to FIG. 12, the image forming apparatus 1 according to the second modification of the first embodiment includes an illumination lamp 20a and an illumination lamp 20b on the top portion of and inside, respectively, the placing portion 21 and is configured such that, as in the first modification of the first embodiment, light from inside the paper ejection unit 4 can transmit through the placing portion 21. Hence, the front surface and the back surface of the placing portion 21 can be irradiated with light emitted from the illumination lamp 20a and light emitted from the illumination lamp 20b, respectively. In the image forming apparatus 1, an illumination lamp to be lit is selectable from the illumination lamps 20a and 20b in response to an operation performed on the illumination operating unit 22, for example.

According to the second modification of the first embodiment, an operator can conduct visual inspection of any one of a standard print medium (an opaque print medium) and a transparent or translucent print medium without moving to a location away from the image forming apparatus 1. Accordingly, an operator can conduct inspection of printed outputs of various types efficiently.

Third Modification of First Embodiment

Figure 13:
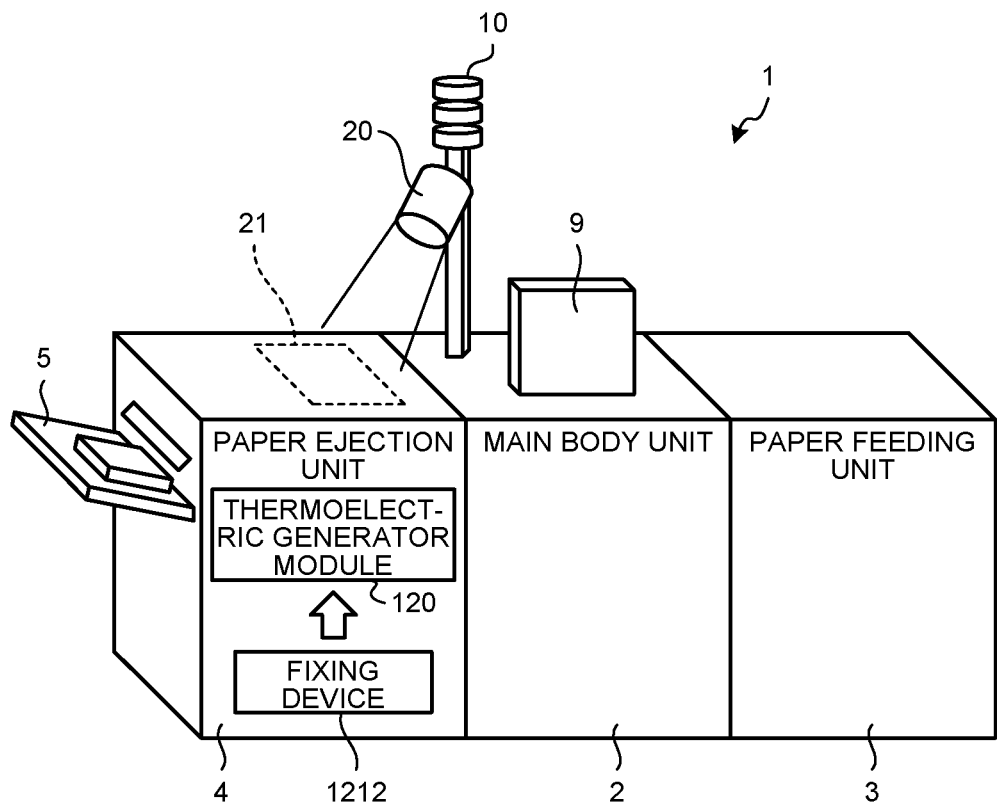
FIG. 13 is a perspective view schematically illustrating appearance of the image forming apparatus according to a third modification of the first embodiment.

A third modification of the first embodiment is described below. The third modification of the first embodiment is an example, in which the illumination lamp 20 is mounted on or integrally with the signal lamp 10 that indicates an operating state of the image forming apparatus 1. FIG. 13 is a perspective view schematically illustrating appearance of the image forming apparatus 1 according to the third modification of the first embodiment.

Referring to FIG. 13, in the image forming apparatus 1 according to the third modification of the first embodiment, the illumination lamp 20 is attached to the signal lamp 10. Because a structure for mounting the illumination lamp 20 can be shared with the signal lamp 10, optimal use of available space around the placing portion 21 can be achieved. This configuration also makes shared use of the light sources of the illumination lamp 20 between the illumination lamp 20 and the signal lamp 10 available.

Second Embodiment

A second embodiment is described below. In the first embodiment and its modifications described above, the fixing device 1212 is used as the heat source 121 for the thermoelectric generator module 120 that supplies power supply to the illumination lamp 20. By contrast, in the second embodiment, heat generation by motors mounted at various locations in the image forming apparatus 1 is used as the heat source 121 for the thermoelectric generator module 120.

Figure 14:
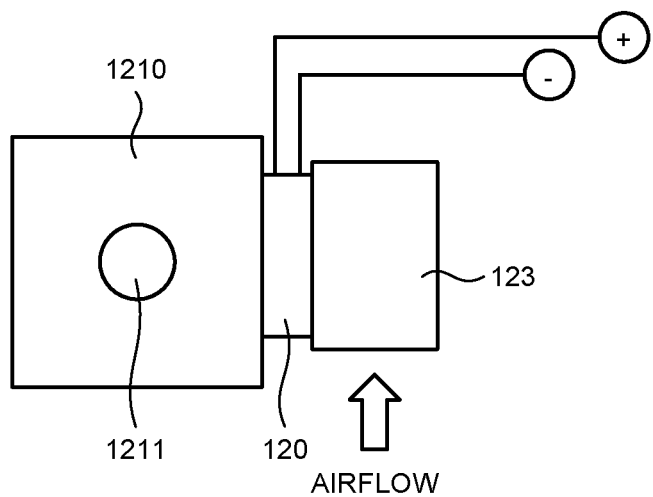
FIG. 14 is a diagram illustrating an example where a motor is used as the heat source for the thermoelectric generator module according to a second embodiment.

FIG. 14 illustrates an example where a motor is used as the heat source 121 for the thermoelectric generator module 120 according to the second embodiment. Referring to FIG. 14, a motor 1210 is, for example, a stepping motor that rotates a shaft 1211 a predetermined angle each time a predetermined voltage is sequentially applied to a plurality of windings provided on a stator. The stepping motor generates heat due to an electric current, which depends on the applied voltage, that flows through each of the windings. The motor 1210 in the image forming apparatus 1 may be used to, for example, drive a conveyance system for conveying a print medium or rotate the photoconductor drum when the image forming apparatus 1 forms an image on a print medium by electrophotography.

The hot surface of the thermoelectric generator module 120 is brought into thermal contact with an outer surface of the motor 1210 using thermal conductive grease or the like. Similarly, the heat radiation plate 123 is brought into thermal contact with the cold surface of the thermoelectric generator module 120 using thermal conductive grease or the like. The heat radiation plate 123 is cooled by an airflow that is generated by a cooling fan, which is for internal cooling of the apparatus, and caused to strike the heat radiation plate 123. When the motor 1210 is driven to rotate and temperature rise occurs in the motor 1210, an airflow from the cooling fan develops the temperature difference $\Delta T$ between the hot surface and the cold surface of the thermoelectric generator module 120. The thermoelectric generator module 120 generates electricity that depends on the temperature difference $\Delta T$.

Figure 15:
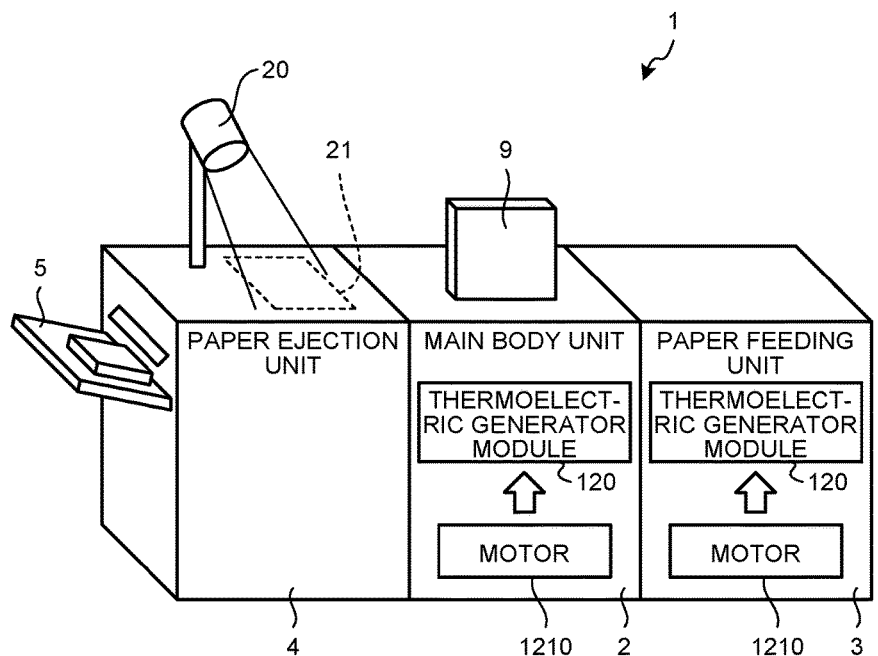
FIG. 15 is a perspective view schematically illustrating appearance of the image forming apparatus according to the second embodiment.

FIG. 15 is a perspective view schematically illustrating appearance of the image forming apparatus 1 according to the second embodiment. As a configuration for driving the illumination lamp 20 in the second embodiment, the same configuration as that of the first embodiment described with reference to FIG. 7 can be used.

Referring to FIG. 15, the thermoelectric generator module 120 is provided for each of the motors 1210, including the motor 1210 provided inside the main body unit 2 to drive the photoconductor drum and the motor 1210 provided inside the paper feeding unit 3 to convey a print medium. The illumination lamp 20 is lit using power supply of electricity generated by the thermoelectric generator modules 120 provided for the motors 1210.

For the sake of description, in FIG. 15, the thermoelectric generator module 120 is depicted as being provided for each of the motors 1210 in the main body unit 2 and the paper feeding unit 3. However, in actual, the image forming apparatus 1 further includes, in the paper ejection unit 4, the motor 1210 for conveying a print medium where an image is formed, for example. The thermoelectric generator module 120 may be provided for the motor 1210 mounted inside the paper ejection unit 4 so that electricity generated by the thermoelectric generator module 120 is also used as power supply of the illumination lamp 20.

Furthermore, the second embodiment is applicable even when the inkjet method is used as the image forming method. When the inkjet method is used, heat generated at an area, such as an ink ejection circuit for ejecting ink from nozzles, where electric power is used is usable. The arrangement of the illumination lamp 20 of each of the above-described modifications of the first embodiment is applicable to the second embodiment.

Also in the second embodiment, because the illumination lamp 20 and the placing portion 21 are mounted on the image forming apparatus 1, an operator can conduct visual inspection of an image formed on a print medium without moving to a location away from the image forming apparatus 1. Accordingly, working efficiency is increased. Furthermore, because the power supply of the illumination lamp 20 is obtained by converting, by the thermoelectric generator module 120, heat generated inside the image forming apparatus 1 into electricity, reduction in power consumption is achievable.

Third Embodiment

A third embodiment is described below. The image forming apparatus 1 according to the third embodiment is configured so as to charge a storage battery with electricity generated by the thermoelectric generator module 120 and light the illumination lamp 20 using the charged electricity.

Figure 16:
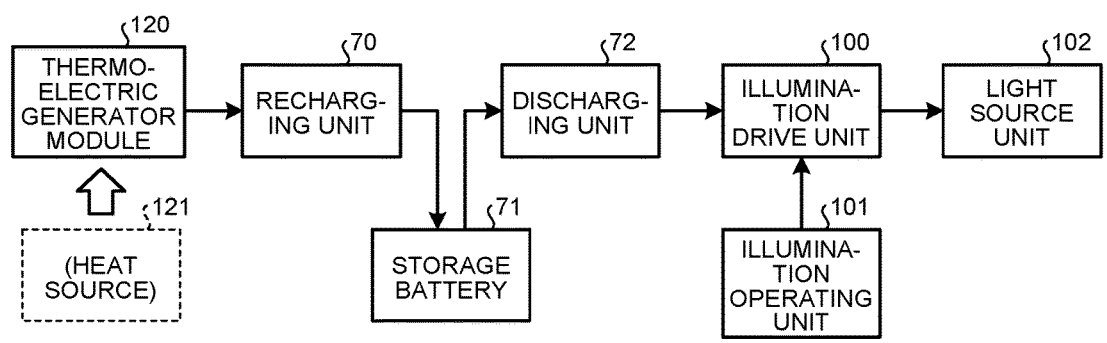
FIG. 16 is a block diagram illustrating an example configuration for driving the illumination lamp according to a third embodiment.

FIG. 16 illustrates an example configuration for driving the illumination lamp 20 of the image forming apparatus 1 according to the third embodiment. As illustrated in FIG. 16, in the third embodiment, in contrast to the above-described configuration of FIG. 7, the image forming apparatus 1 includes a recharging unit 70, a storage battery 71, and a discharging unit 72 in lieu of the voltage converter 50. For example, an electrical double-layer capacitor, which is a capacitor whose capacitance is increased by utilizing an electrical double layer, can be used as the storage battery 71. The recharging unit 70, the storage battery 71, and the discharging unit 72 are included in the sub power-supply unit 231 of FIG. 2.

Referring to FIG. 16, electricity generated by the thermoelectric generator module 120 is supplied to the recharging unit 70. The recharging unit 70 controls charging the storage battery 71. More specifically, the recharging unit 70 converts the electricity supplied from the thermoelectric generator module 120 into electricity of a voltage suitable for storage in the storage battery 71 and supplies the voltage-converted electricity to the storage battery 71, thereby charging the storage battery 71 with a constant current. When the recharging unit 70 determines that a charging voltage is equal to or higher than a preset value (e.g., 1.5 V), the recharging unit 70 causes transition of charging the storage battery 71 from constant-current charging to constant-power charging to occur, thereby suppressing an increase in electric power used in the charging. When the recharging unit 70 determines that the charging voltage has further increased to reach a desired charging voltage, the recharging unit 70 determines that charging the storage battery 71 is completed and stops the charging operation.

The discharging unit 72 controls discharging the storage battery 71 and draws electricity of a predetermined voltage value out from the storage battery 71. More specifically, the discharging unit 72 performs constant-voltage control on the electricity output from the storage battery 71 and outputs electricity having a constant voltage value. The electricity output from the discharging unit 72 is supplied to the illumination drive unit 100. The illumination drive unit 100 outputs the electricity supplied from the discharging unit 72 as power supply for the light source unit 102 in a manner similar to that described above. The illumination drive unit 100 also controls on and off of light emission and light-emission intensity of the light source unit 102 in accordance with a control signal fed from the illumination operating unit 101 in response to an operation performed on the illumination operating unit 101.

As described above, in the third embodiment, the storage battery 71 is charged with electricity generated by the thermoelectric generator module 120, and the illumination lamp 20 is lit using output of the storage battery 71. Accordingly, power involved in lighting the illumination lamp 20 can be saved. Furthermore, even in a condition where the main power-supply unit 230 is off or where the operating mode is in the sleep mode, the image forming apparatus 1 can light the illumination lamp 20, and therefore an operator to conduct inspection of a printed print medium.

The arrangement of the illumination lamp 20 of each of the above-described first embodiment and its modifications is applicable to the third embodiment as well. In the third embodiment, as the heat source 121 for the thermoelectric generator module 120, the fixing device 1212 described in the first embodiment may be used or, alternatively, the motors 1210 described in the second embodiment may be used. As the heat source 121, both the fixing device 1212 and the motors 1210 may be used.

In the image forming apparatus 1 according to the third embodiment, the illumination lamp 20 and the storage battery 71 may be configured to be detachable from the image forming apparatus 1 by mounting the storage battery 71 inside the retainer that holds the illumination lamp 20 above the paper ejection unit 4.

Fourth Embodiment

A fourth embodiment is described below. The image forming apparatus 1 according to the fourth embodiment lights the illumination lamp 20 using output of the above-described storage battery 71 of the third embodiment and commercial power supply for driving the image forming apparatus 1.

Figure 17:
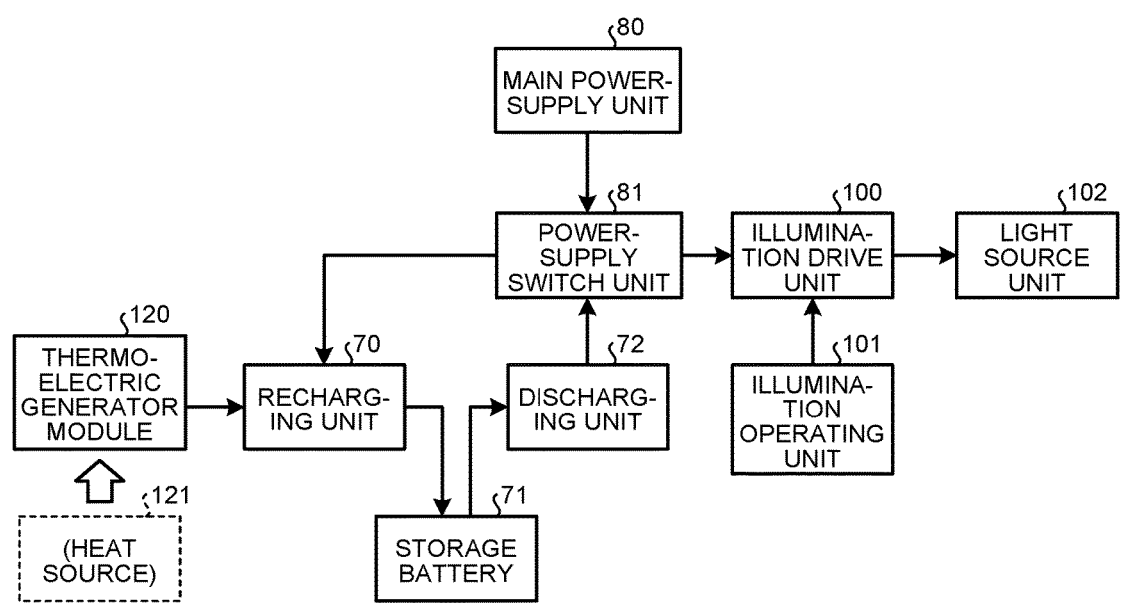
FIG. 17 is a block diagram illustrating an example configuration for driving the illumination lamp according to a fourth embodiment.

FIG. 17 illustrates an example configuration for driving the illumination lamp 20 of the image forming apparatus 1 according to the fourth embodiment. As illustrated in FIG. 17, the image forming apparatus 1 of the fourth embodiment includes, in addition to the above-described elements illustrated in FIG. 16, a main power-supply unit 80 and a power-supply switch unit 81. Note that the commercial power supply is supplied to the main power-supply unit 80 that corresponds to the main power-supply unit 230 of FIG. 2. The power-supply switch unit 81 corresponds to the power-supply switch unit 232 of FIG. 2. As in the example of FIG. 16, the recharging unit 70, the storage battery 71, and the discharging unit 72 are included in the sub power-supply unit 231 of FIG. 2.

The main power-supply unit 80 converts alternating-current voltage coming from the commercial power supply into a direct-current voltage and further converts a voltage value of the converted direct-current voltage into a predetermined voltage value. The electricity, into which the commercial power supply is converted to the direct-current voltage of the predetermined voltage value, is supplied to the power-supply switch unit 81 as output of the main power-supply unit 80. Furthermore, output of the discharging unit 72 is supplied to the power-supply switch unit 81.

The power-supply switch unit 81 supplies the output of the main power-supply unit 80 to the illumination drive unit 100 when the operating mode of the image forming apparatus 1 is the normal mode or, put another way, when the main power-supply unit 80 is energized. On the other hand, the power-supply switch unit 81 supplies the output of the discharging unit 72 to the illumination drive unit 100 when the operating mode of the image forming apparatus 1 is the sleep mode, or when the main power-supply unit 80 is off and therefore the main power-supply unit 80 is non-energized.

The power-supply switch unit 81 can further supply the output of the main power-supply unit 80 to the recharging unit 70 when the main power-supply unit 80 is energized. The recharging unit 70 can charge the storage battery 71 with the output of the main power-supply unit 80 supplied via the power-supply switch unit 81.

As described above, the image forming apparatus 1 according to the fourth embodiment allows, when the main power-supply unit 80 is on or, more specifically, when an image forming process in the image forming apparatus 1 is in progress or on standby, an operator to conduct inspection of a printed print medium by lighting the illumination lamp 20 using the commercial power supply. When the main power-supply unit 80 is off or when the operating mode of the image forming apparatus 1 is the sleep mode, an operator can conduct inspection of a printed print medium by lighting the illumination lamp 20 using the electricity stored in the storage battery 71.

The arrangement of the illumination lamp 20 of each of the above-described first embodiment and its modifications is applicable to the fourth embodiment as well. In the fourth embodiment, as the heat source 121 for the thermoelectric generator module 120, the fixing device 1212 described in the first embodiment may be used or, alternatively, the motors 1210 described in the second embodiment may be used. As the heat source 121, both the fixing device 1212 and the motors 1210 may be used. In the image forming apparatus 1 according to the fourth embodiment, the illumination lamp 20 and the storage battery 71 may be configured to be detachable from the image forming apparatus 1 by mounting the storage battery 71 inside the retainer that holds the illumination lamp 20 above the paper ejection unit 4.

According to the present embodiments, inspection of a printed output printed by an image forming apparatus can be conducted efficiently.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

The method steps, processes, or operations described herein are not to be construed as necessarily requiring their performance in the particular order discussed or illustrated, unless specifically identified as an order of performance or clearly identified through the context. It is also to be understood that additional or alternative steps may be employed.

What is claimed is:

1. An image forming apparatus comprising:
   an image forming unit configured to form an image on a medium on which an image is to be formed;
   a placing portion capable of placing the medium;
   a power generator configured to generate electricity from heat generated inside the image forming unit; and
   an illumination unit configured to be lit with the electricity generated by the power generator and to be capable of irradiating at least the placing portion with light wherein the illumination unit is lit with electricity output from a storage battery charged with the electricity generated by the power generator.

2. The image forming apparatus according to claim 1, wherein the power generator generates the electricity from heat generated at least at a motor for conveying the medium.

3. The image forming apparatus according to claim 1, wherein the power generator generates the electricity from heat generated at a heating unit that heats the medium, on which the image is formed.

4. The image forming apparatus according claim 1, wherein the image forming unit forms the image by electrophotography.

5. The image forming apparatus according to claim 1, wherein the image forming unit forms the image by an inkjet method.

6. The image forming apparatus according to claim 1, wherein the illumination unit further includes
   a plurality of light sources configured to emit light of a plurality of colors, from which white light can be created by additive color mixing, and
   an adjusting unit configured to adjust light-emission intensity of each of the plurality of light sources in accordance with an instruction.

7. The image forming apparatus according to claim 1, wherein the illumination unit irradiates a surface of the placing portion, the surface being on a side where the medium is to be placed.

8. The image forming apparatus according to claim 1, wherein
   the placing portion is configured to allow light to transmit therethrough, and
   the illumination unit irradiates a surface of the placing portion, the surface being on a side opposite from a side where the medium is to be placed.

9. The image forming apparatus according to claim 1, wherein the illumination unit is included in a signal lamp indicating an operating state of the image forming unit.

10. The image forming apparatus according to claim 1, wherein the illumination unit is attached to a signal lamp indicating an operating state of the image forming unit.

11. The image forming apparatus according to claim 1, wherein the illumination unit includes the storage battery and is configured to be detachable from the image forming unit.

12. The image forming apparatus according to claim 1, further comprising:
   an air blower mechanism that causes airflow to strike a heat radiation plate that is in thermal contact with the power generator, wherein the airflow cools the power generator.

* * * * *